(12) United States Patent
Chen et al.

(10) Patent No.: US 11,742,296 B2
(45) Date of Patent: Aug. 29, 2023

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Wei-Jhen Chen, Taichung (TW);
Chih-Hsun Hsu, Taichung (TW);
Yuan-Hung Hsu, Taichung (TW);
Chih-Nan Lin, Taichung (TW);
Chang-Fu Lin, Taichung (TW);
Don-Son Jiang, Taichung (TW);
Chih-Ming Huang, Taichung (TW);
Yi-Hsin Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 23 days.

(21) Appl. No.: 17/134,925

(22) Filed: Dec. 28, 2020

(65) Prior Publication Data

US 2022/0148975 A1 May 12, 2022

(30) Foreign Application Priority Data

Nov. 12, 2020 (TW) .................................. 109139525

(51) Int. Cl.
*H01L 23/538* (2006.01)
*H01L 21/48* (2006.01)
(Continued)

(52) U.S. Cl.
CPC ...... *H01L 23/5386* (2013.01); *H01L 21/4853* (2013.01); *H01L 21/4857* (2013.01); *H01L 21/563* (2013.01); *H01L 21/6835* (2013.01); *H01L 23/3157* (2013.01); *H01L 23/5381* (2013.01); *H01L 23/5383* (2013.01); *H01L 24/16* (2013.01); *H01L 25/0655* (2013.01);
(Continued)

(58) Field of Classification Search
CPC ............. H01L 23/5386; H01L 21/4853; H01L 21/4857; H01L 21/563; H01L 21/6835; H01L 23/3157; H01L 23/5381; H01L 23/5383; H01L 24/16; H01L 25/0655; H01L 25/50; H01L 2221/68359; H01L 2224/16227; H01L 2924/18161; H01L 2224/16225; H01L 2224/32225; H01L 2224/73204; H01L 2924/15311; H01L 2924/181
See application file for complete search history.

(56) References Cited

U.S. PATENT DOCUMENTS

2003/0000998 A1* 1/2003 Yamauchi ............... H01L 24/29
228/180.1
2013/0065362 A1* 3/2013 Horng ................... H01L 21/563
257/E21.599
(Continued)

*Primary Examiner* — Selim U Ahmed
*Assistant Examiner* — Evan G Clinton
(74) *Attorney, Agent, or Firm* — Kelly & Kelley, LLP (57) ABSTRACT

An electronic package and a manufacturing method thereof, which embeds an electronic structure acting as an auxiliary functional component and a plurality of conductive pillars in an encapsulation layer, and disposes an electronic component on the encapsulation layer, so as to facilitate electrical transmission with the electronic component in a close range.

8 Claims, 12 Drawing Sheets

(51) Int. Cl.
*H01L 21/56* (2006.01)
*H01L 21/683* (2006.01)
*H01L 23/31* (2006.01)
*H01L 23/00* (2006.01)
*H01L 25/065* (2023.01)
*H01L 25/00* (2006.01)

(52) U.S. Cl.
CPC .... *H01L 25/50* (2013.01); *H01L 2221/68359* (2013.01); *H01L 2224/16227* (2013.01); *H01L 2924/18161* (2013.01)

(56) References Cited

U.S. PATENT DOCUMENTS

| | | | |
|---|---|---|---|
| 2020/0098692 A1* | 3/2020 | Liff | H01L 23/5386 |
| 2021/0193577 A1* | 6/2021 | Lin | H01L 23/3128 |
| 2022/0013461 A1* | 1/2022 | Lin | H01L 23/5383 |

* cited by examiner

ELECTRONIC PACKAGE AND MANUFACTURING METHOD THEREOF

BACKGROUND

1. Technical Field

The present disclosure relates to an electronic package and a manufacturing method thereof, and more specifically, to an electronic package having an auxiliary functional component and a manufacturing method thereof.

2. Description of Related Art

With the rapid development in electronic industry, electronic products are trending towards multiple functions and high performance. For instance, auxiliary functional components such as integrated voltage regulators (IVRs) have been embedded into high-performance processors to improve efficiency (e.g., the on/off frequency) and reduce power consumption, and to also increase reliability or even reduce manufacturing cost. Meanwhile, techniques currently used in the field of chip packaging include flip-chip packaging modules, such as Chip Scale Package (CSP), Direct Chip Attached (DCA) or Multi-Chip Module (MCM), or chip stacking techniques involving stacking chips one on top of another to be integrated into a three-dimensional (3D) integrated circuit (IC).

Figure 1:
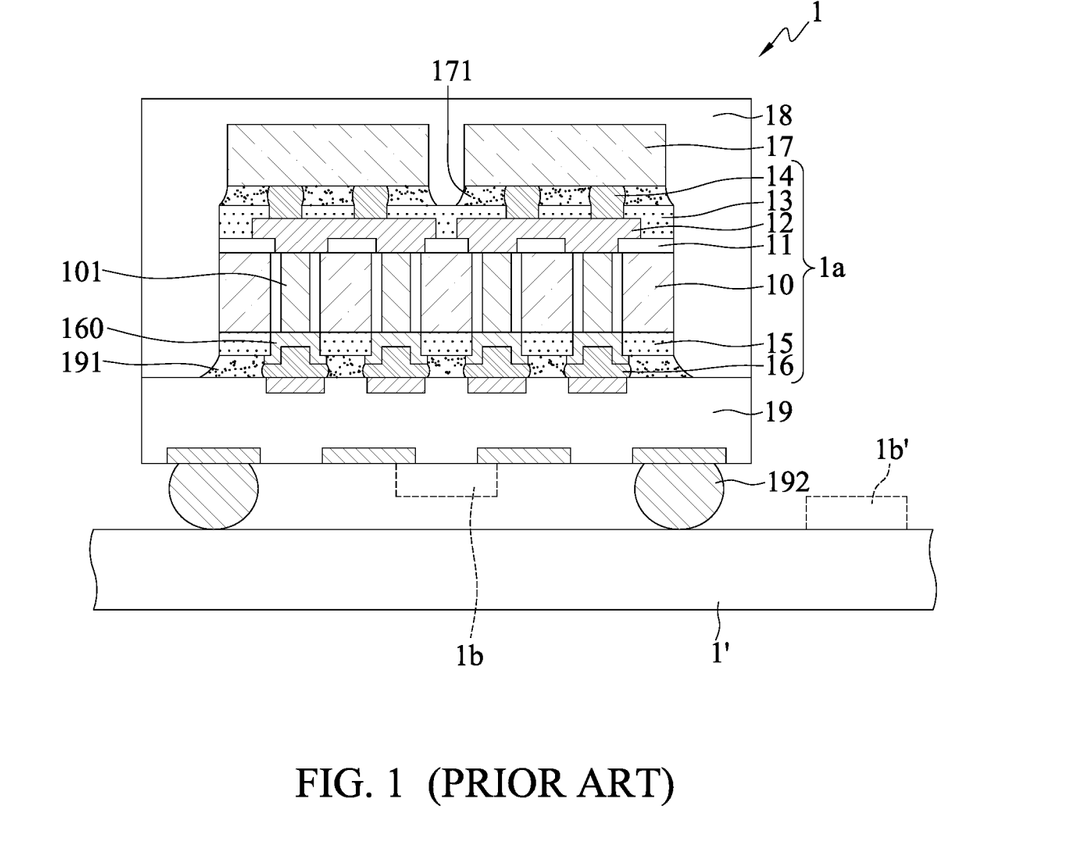
FIG. 1 is a schematic cross-sectional view of a conventional package structure.

FIG. 1 is a schematic cross-sectional view depicting a package structure 1 of a conventional 3D IC chip stack. As shown in FIG. 1, the package structure 1 includes a through silicon interposer (TSI) 1a, which includes a silicon body 10 and a plurality of conductive through-silicon vias (TSVs) 101 formed therein. A redistribution layer (RDL) is formed on a surface of the silicon body 10 electrically connected with the conductive TSVs 101. More specifically, the RDL includes a dielectric layer 11 and a circuit layer 12, and the circuit layer 12 is electrically connected with conductive TSVs 101. An insulating protective layer 13 is formed on the dielectric layer 11 and the circuit layer 12, and portions of the circuit layer 12 are exposed from the insulating protective layer 13 and are bonded to a plurality of solder bumps 14.

In addition, another insulating protective layer 15 can first be formed on the silicon body 10, such that ends of the conductive TSVs 101 are exposed from the insulating protective layer 15 and are bonded with a plurality of solder bumps 16. The solder bumps 16 are electrically connected with the conductive TSVs 101, wherein an under bump metallurgy (UBM) 160 can be optionally formed on the ends of the conductive TSVs 101 for attachment to the solder bumps 16.

Furthermore, the package structure 1 further includes a package substrate 19 for disposing the TSI 1a thereon via the solder bumps 16, such that the package substrate 19 can be electrically connected with the conductive TSVs 101. The solder bumps 16 are encapsulated with an underfill 191.

In addition, the package structure 1 further includes a plurality of System-On-Chip (SOC) semiconductor chips 17 that are disposed on the solder bumps 14, so that the semiconductor chips 17 are electrically connected with the circuit layer 12, and the solder bumps 14 are encapsulated by an underfill 171. An encapsulant 18 is formed on the package substrate 19, such that the semiconductor chips 17 and the TSI 1a are encapsulated by the encapsulant 18.

In a subsequent application, the package structure 1 can be formed with a plurality of solder balls 192 on the lower side of the package substrate 19, so as to be attached onto a circuit board 1'.

In an early commercialized product, an auxiliary functional component 1b', such as an integrated voltage regulator (IVR), is directly provided on the circuit board 1', but this approach means that the volume of the end product cannot fulfill the requirements of light, thin and compact products. In addition, the distance between the auxiliary functional component 1b' and the package structure 1 is too far, resulting in long signal transmission path to the semiconductor chips 17 to which it is electrically connected, and thus degrading the electrical functions and increasing power consumption.

In view of this, there has been an approach in which the auxiliary functional component 1b is integrated to the lower side of the package substrate 19 in order to shorten the transmission distance between the auxiliary functional component 1b and the semiconductor chips 17, thereby reducing the surface area and volume of the circuit board 1'.

However, driven by consumer demands, end products today need to offer more and more functions, this increases the amount of semiconductor chips 17 that need to be disposed on the package substrate 19 as well as the amount of auxiliary functional components 1b that work in conjunction with them. As a result, there is not enough room on the lower side of the package substrate 19 for more auxiliary functional components 1b, and it becomes difficult for a single package structure 1 to satisfy the demands for light, thin and compact end products with low power consumption and high electrical performance.

Moreover, although it is possible to integrate the auxiliary functional components 1b into the semiconductor chips 17, but the package structure 1 would need to be redesign, this would not only increase the cost of manufacturing, but also require expansion to the sizes of the semiconductor chips 17 themselves, and the demand for miniaturization cannot be met.

Therefore, there is a need for a solution that addresses the aforementioned issues in the prior art.

SUMMARY

In view of the aforementioned shortcomings of the prior art, the present disclosure provides an electronic package, which may include an encapsulation layer having a first surface and a second surface opposite to each other; a plurality of conductive pillars embedded in the encapsulation layer; and an electronic structure embedded in the encapsulation layer and including: an electronic body having a first side and a second side opposite to each other, and including a base and a circuit portion formed on the base, wherein the second side is defined by the base, and the first side is defined by the circuit portion, and the base includes a plurality of conductive vias electrically connected to the circuit portion and exposed from the second side; a plurality of first conductors formed on the first side of the electronic body to electrically connect with the circuit portion; a plurality of second conductors formed on the second side of the electronic body to electrically connect with the conductive vias; a bonding layer formed on the first side of the electronic body to cover the first conductors; and an insulating layer formed on the second side of the electronic body to cover the second conductors.

The present disclosure further provides a method of manufacturing an electronic package, which may include:

providing an electronic body having a first side and a second side opposite to each other, and including a base and a circuit portion formed on the base, wherein the second side is defined by the base, and the first side is defined by the circuit portion, and the base includes a plurality of conductive vias electrically connected to the circuit portion and exposed from the second side; forming a plurality of first conductors and second conductors on the first side and the second side of the electronic body, respectively, wherein the first conductors are electrically connected to the circuit portion, and the second conductors are electrically connected with the conductive vias; forming a bonding layer and an insulating layer on the first side and the second side of the electronic body, respectively, wherein the first conductors are covered by the bonding layer, and the second conductors are covered by the insulating layer to form an electronic structure; disposing the electronic structure on a carrier with the bonding layer thereof, a plurality of conductive pillars being formed on the carrier; forming an encapsulation layer on the carrier to cover the electronic structure and the conductive pillars, wherein the encapsulation layer has a first surface and a second surface opposite to each other, and the encapsulation layer is bonded to the carrier at the first surface thereof; and removing the carrier.

In the aforementioned electronic package and manufacturing method thereof, the base of the electronic body is a silicon material.

In the aforementioned electronic package and manufacturing method thereof, the first conductors are metal pillars or solder materials.

In the aforementioned electronic package and manufacturing method thereof, before disposing the electronic structure on the carrier, the present disclosure further comprises forming auxiliary conductors on the first conductors, the auxiliary conductors being covered by the bonding layer.

In the aforementioned electronic package and manufacturing method thereof, before disposing the electronic structure on the carrier, the present disclosure further comprises exposing the first conductors from the bonding layer.

In the aforementioned electronic package and manufacturing method thereof, the second surface of the encapsulation layer is flush with ends of the conductive pillars, the insulating layer or the second conductors.

In the aforementioned electronic package and manufacturing method thereof, ends of the conductive pillars, the insulating layer or the second conductors are exposed from the second surface of the encapsulation layer.

The aforementioned electronic package and manufacturing method thereof may further include, after removing the carrier, forming a circuit structure on the first surface of the encapsulation layer to electrically connect the circuit structure with the electronic structure and the plurality of conductive pillars. For example, the first conductors are electrically connected with the circuit structure through conductive bumps.

The aforementioned electronic package and manufacturing method thereof may further include, after removing the carrier, forming a plurality of conductive components on the first surface of the encapsulation layer to electrically connect the plurality of conductive components with the conductive pillars and/or the first conductors.

The aforementioned electronic package and manufacturing method thereof may further include forming a circuit structure on the second surface of the encapsulation layer to electrically connect the circuit structure with the conductive pillars and the second conductors. For example, the aforementioned electronic package and manufacturing method thereof may further include attaching an electronic component onto the circuit structure to electrically connect the electronic component with the circuit structure.

The aforementioned electronic package and manufacturing method thereof may further include attaching an electronic component onto the second surface of the encapsulation layer to electrically connect the electronic component with the second conductors and/or the conductive pillars.

The aforementioned electronic package and manufacturing method thereof may further include attaching a plurality of electronic components onto the second surface of the encapsulation layer, wherein at least two of the plurality of electronic components are electrically connected to the second conductors, such that the electronic structure acts as an electrical bridge component between the at least two electronic components.

As can be understood from the above, the electronic package and the manufacturing method thereof in accordance with the present disclosure allows the electronic structure to be used as an auxiliary functional component and embedded in the encapsulation layer, so that it can be used in cooperation with the electronic component at a close range. Therefore, compared to the prior art, the present disclosure requires no redesigning of the electronic package, thereby greatly reducing the manufacturing cost. Also, there is no need to expand the size of the electronic component, and the demand for miniaturization can thus be satisfied while achieving high electrical performance.

BRIEF DESCRIPTION OF THE DRAWINGS

FIG. 2G' and FIG. 2G" are schematic cross-sectional views of other embodiments of FIG. 2G.

FIG. 3F' is a schematic cross-sectional view of another embodiment of FIG. 3F.

DETAILED DESCRIPTION

The ways in which the present disclosure can be implemented are illustrated in the following embodiments. One of ordinary skill in the art can readily appreciate other advantages and technical effects of the present disclosure based on the disclosed contents herein.

It should be noted that the structures, ratios, sizes shown in the appended drawings are to be construed in conjunction with the disclosures herein in order to facilitate understanding of those skilled in the art. They are not meant, in any way, to limit the implementations of the present disclosure, and therefore contain no substantial technical meaning. Without influencing the effects created and the objectives achieved by the present disclosure, any modifications, changes or adjustments to the structures, ratios or sizes should fall within the scope encompassed by the technical contents disclosed herein. Meanwhile, terms such as "above," "first," "second," "third," "a," "an," and the like, are for illustrative purposes, and are not meant to limit the scope in which the present disclosure can be implemented. Any variations or modifications made to their relative relationships, without changing the substantial technical contents, are also to be construed as within the scope of the present disclosure.

FIGS. 2A to 2G are schematic cross-sectional views illustrating a method for manufacturing an electronic package 2 in accordance with a first embodiment of the present disclosure.

Figure 2A:
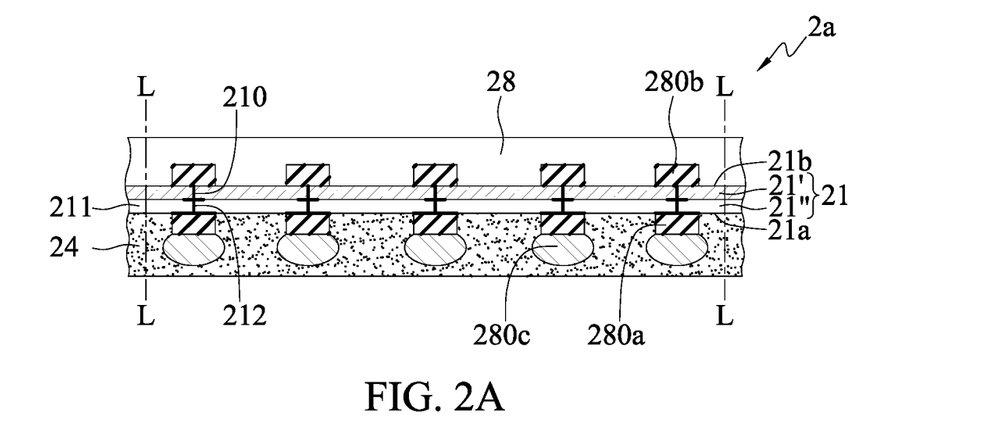
FIGS. 2A to 2G are schematic cross-sectional views illustrating a method for manufacturing an electronic package in accordance with a first embodiment of the present disclosure.

As shown in FIG. 2A, a panel-form wafer body 2a is provided, which includes a plurality of electronic bodies 21 arranged in an array, and each electronic body 21 includes a first side 21a and a second side 21b opposite to each other. Then, a plurality of first conductors 280a and a plurality of second conductors 280b are formed on the first side 21a and the second side 21b of the electronic body 21, respectively. An auxiliary conductor 280c is formed on each of the first conductors 280a. A bonding layer 24 and an insulating layer 28 are further formed on the first side 21a and the second side 21b of the electronic body 21, respectively, such that the bonding layer 24 covers the first conductors 280a and the auxiliary conductors 280c, whereas the insulating layer 28 covers the second conductors 280b.

In an embodiment, the electronic body 21 is an active component, such as a semiconductor chip, including a silicon base 21' and a circuit portion 21" formed on the base 21'. The base 21' includes a plurality of conductive vias 210 exposed from the base 21', such as conductive through silicon vias (TSVs) for electrically connecting with the circuit portion 21". For instance, the circuit portion 21" includes at least one passivation layer 211 and a circuit layer 212 combined with the passivation layer 211, and the circuit layer 212 is electrically connected with the conductive vias 210. More specifically, the base 21' defines the second side 21b, while the circuit portion 21" defines the first side 21a. It can be appreciated that there are numerous types of structures of active components including the conductive vias 210, and the present disclosure is not limited to the above.

Moreover, the exposed two ends of each of the conductive vias 210 are in contact with the circuit layer 212 and one of the second conductors 280b, respectively, such that the first conductors 280a and the second conductors 280b are electrically connected with the circuit layer 212 and the conductive vias 210. For example, a thinning process can be performed, such as by polishing, to remove portions of the second side 21b (or the base 21') of the electronic body 21, such that the conductive vias 210 are exposed from the second side 21b to contact the second conductors 280b.

In addition, the first conductors 280a and the second conductors 280b are metal (e.g., copper) pillars, and the auxiliary conductors 280c are bumps including a solder material.

Moreover, the composition of the bonding layer 24 is different from that of the insulating layer 28. For example, the bonding layer 24 can be a paste (which can be melted upon heating), such as a non-conductive film (NCF), and the insulating layer 28 is a dielectric or passivation material.

Figure 2B:
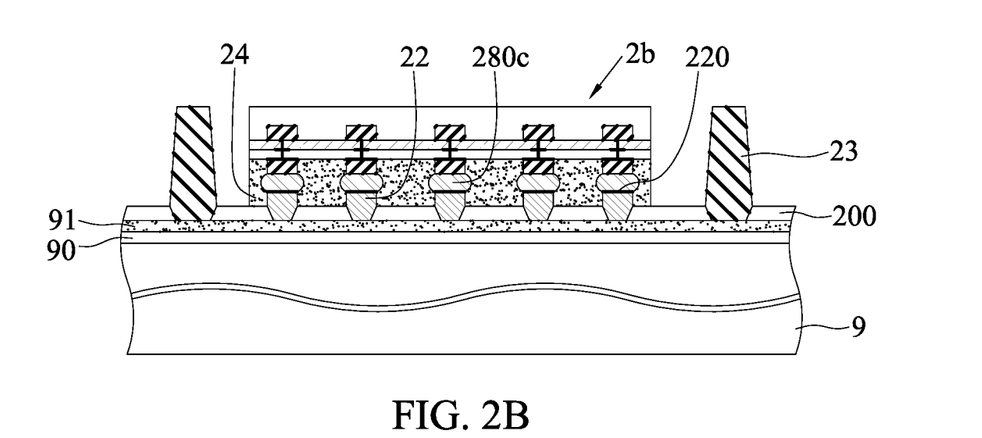

As shown in FIG. 2B, a singulation process is carried out along cutting paths L shown in FIG. 2A to obtain a plurality of electronic structures 2b. Next, a carrier 9 with a dielectric layer 200 is provided, wherein a plurality of conductive bumps 22 and a plurality of conductive pillars 23 are formed on the dielectric layer 200. At least one electronic structure 2b is disposed on the conductive bumps 22.

In an embodiment, the dielectric layer 200 can be made of polybenzoxazole (PBO), polyimide (PI), a prepreg (PP), or other dielectric material, and the conductive bumps 22 can be metal bumps, such as copper pillars or solder balls.

Moreover, the carrier 9 can be, for example, a semiconductor (e.g., silicon or glass) board. Depending on the needs, a release layer 90 and an adhesive layer 91 can be sequentially formed on the carrier 9, such that the dielectric layer 200 can be disposed on the adhesive layer 91.

Furthermore, the conductive pillars 23 are formed on the dielectric layer 200 by electroplating, and the conductive pillars 23 are made of metal (e.g., copper) or solder materials.

In addition, the bonding layer 24 of the electronic structure 2b is pressed against on the dielectric layer 200 through thermal compression, such that the auxiliary conductors 280c are bonded to the conductive bumps 22, and the conductive bumps 22 are then electrically connected to the electronic structure 2b. For example, the bonding layer 24 covers the conductive bumps 22, and a surface treatment layer 220 can be formed on the conductive bumps 22, such as nickel/gold (Ni/Au), nickel/palladium/gold (Ni/Pd/Au) or an organic solder preservative (OSP), to facilitate bonding with the auxiliary conductors 280c.

Figure 2C:
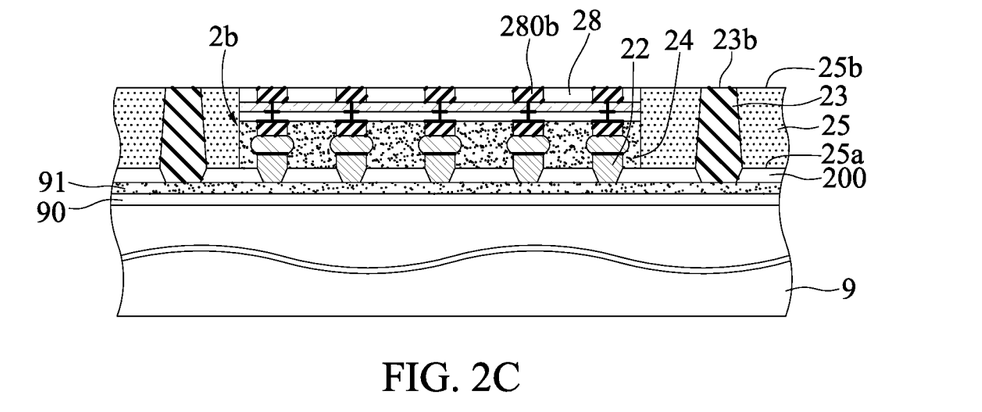

As shown in FIG. 2C, an encapsulation layer 25 is formed on the dielectric layer 200, such that the encapsulation layer 25 covers the electronic structure 2b and the conductive pillars 23, wherein the encapsulation layer 25 has a first surface 25a and a second surface 25b opposite to each other, and is bonded to the dielectric layer 200 via its first surface 25a. Then, a planarization process is performed, so as to make the second surface 25b of the encapsulation layer 25 flush with ends 23b of the conductive pillars 23 and the insulating layer 28 of the electronic structure 2b (or the ends of the second conductors 280b), allowing the ends 23b of the conductive pillars 23 and the insulating layer 28 of the electronic structure 2b (or the ends of the second conductors 280b) to be exposed from the second surface 25b of the encapsulation layer 25.

In an embodiment, the encapsulation layer 25 is an insulating material, such as an encapsulant made of epoxy resin, and can be formed on the dielectric layer 200 by lamination or molding.

Moreover, the planarization process includes removing a portion of the conductive pillars 23, a portion of the insulating layer 28 (or the second conductors 280b) of the electronic structure 2b, and a portion of the encapsulation layer 25 by polishing.

Figure 2D:
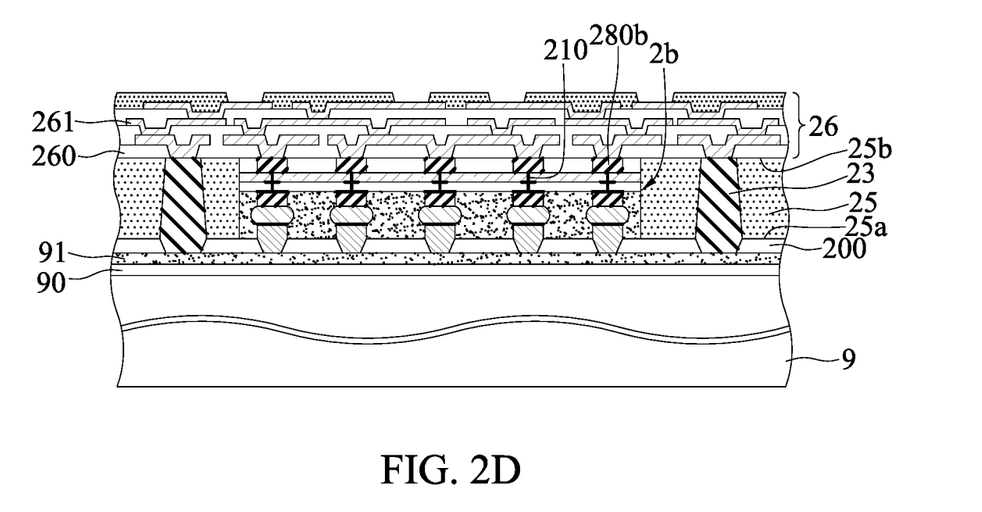

As shown in FIG. 2D, a circuit structure 26 is formed on the second surface 25b of the encapsulation layer 25, and the circuit structure 26 is electrically connected with the conductive pillars 23 and the second conductors 280b of the electronic structure 2b.

In an embodiment, the circuit structure 26 includes a plurality of dielectric layers 260 and a plurality of RDLs 261 disposed on the dielectric layers 260. The outermost dielectric layer 260 can be used as a solder resist layer, and the outermost RDL 261 is partially exposed from the solder resist layer. Alternatively, the circuit structure 26 can include only a single dielectric layer 260 and a single RDL 261.

In addition, the RDLs 261 can be made of copper, while the dielectric layers 260 can be made of a dielectric material, such as PBO, PI, a prepreg or other dielectric materials.

Figure 2E:
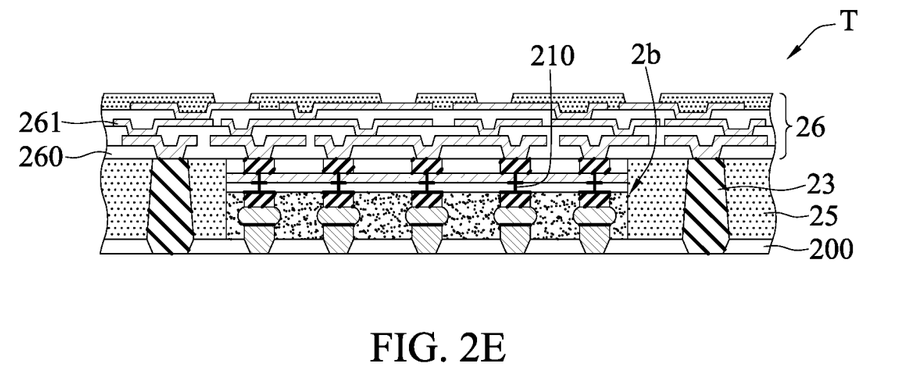

As shown in FIG. 2E, the carrier 9 as well as the release layer 90 and the adhesive layer 91 thereon are removed to expose the dielectric layer 200, thereby exposing the conductive pillars 23 and the conductive bumps 22 from the dielectric layer 200.

In an embodiment, the encapsulation layer 25, the electronic structure 2b and the conductive pillars 23 can act as a package portion T, and may include the circuit structure 26 if needed.

Figure 2F:
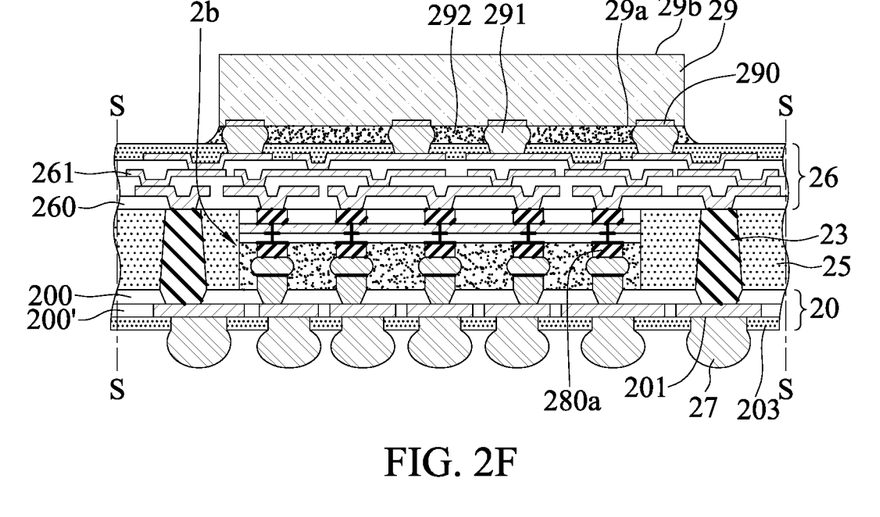

As shown in FIG. 2F, at least one electronic component 29 is attached onto the outermost RDL 261, and a plurality of conductive components 27 (e.g., solder balls) are formed on the first surface 25a of the encapsulation layer 25, such that the plurality of the conductive components 27 are electrically connected with the conductive pillars 23 and/or the first conductors 280a of the electronic structure 2b.

In an embodiment, the dielectric layer 200 can be formed into another circuit structure 20, which includes a plurality of dielectric layers 200, 200' and a RDL 201 disposed on the dielectric layers 200, 200'. For example, the RDL 201 can be made of copper, while the dielectric layers 200, 200' can be made of dielectric material, such as PBO, PI, prepreg or the like. Also, an insulating protective layer 203, such as a solder resist layer, can be formed on the dielectric layer 200', and a plurality of openings are formed on the insulating protective layer 203 to expose the RDL 201 from the openings to facilitate bonding with the conductive components 27. As such, the conductive components 27 can be electrically connected with the conductive pillars 23 and/or the first conductors 280a via the circuit structure 20.

Moreover, the electronic component 29 is an active component, a passive component or a combination of both, wherein the active component can be, for example, a semiconductor chip, and the passive component can be, for example, a resistor, a capacitor, or an inductor. For instance, the electronic component 29 is a semiconductor chip, such as a System-On-Chip (SOC) functional chip with an active face 29a and a non-active face 29b opposite to each other. The electronic component 29 is disposed on the RDL 261 and electrically connected with the RDL 261 through electrode pads 290 on its active face 29a and a plurality of conductive bumps 291 (e.g., a solder material) by flip-chip bonding. The conductive bumps 291 are encapsulated by an underfill 292. Alternatively, the electronic component 29 is disposed on the circuit structure 26 with its non-active face 29b, and is electrically connected with the RDL 261 via a plurality of bonding wires (not shown) through wire bonding, or is electrically connected with the RDL 261 via conductive materials, such as conductive adhesive or solder (not shown). However, the way in which the electronic component 29 is electrically connected to the RDL 261 is not limited to those described above.

Figure 2G:
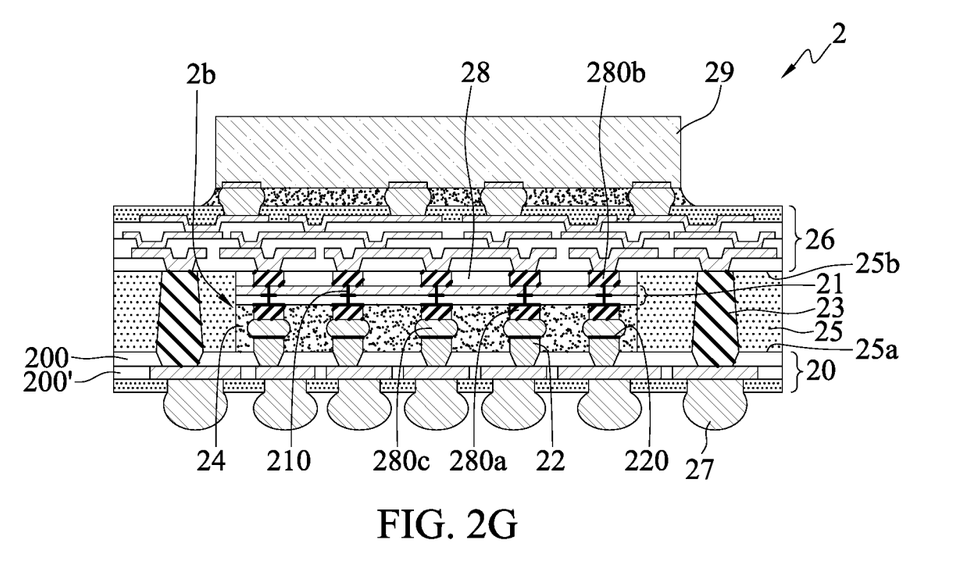
Figure 2H:
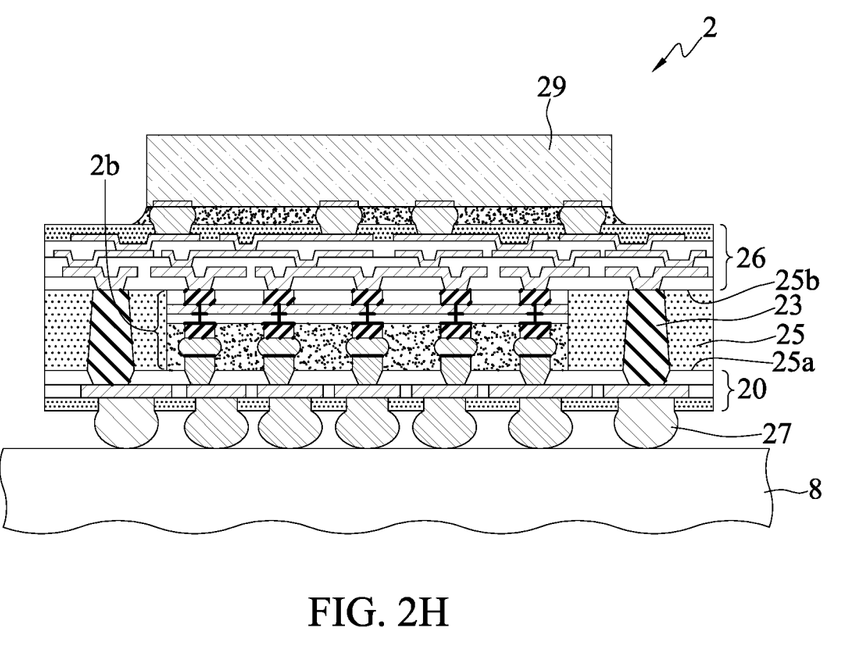
FIG. 2H is a schematic cross-sectional view of a subsequent process of FIG. 2G.

As shown in FIG. 2G, a singulation process is performed on the package portion T along cutting paths S as shown to obtain the electronic package 2. In the subsequent process, as shown in FIG. 2H, the electronic package 2 can be attached to an upper side of a wiring board 8 through the conductive components 27. The wiring board 8 can be an organic board body (e.g., a package substrate having a core layer and circuits or coreless package substrate having circuits) or an inorganic board body (e.g., silicon board material), and a lower side of the wiring board 8 can be attached onto an electronic device such as a circuit board (not shown).

Furthermore, in another embodiment, an electronic package 2' as shown in FIG. 2G' can be manufactured without the circuit structure 26 as needed. For instance, a plurality of electronic components 29, 29' are attached onto the second surface 25b of the encapsulation layer 25, such that each of the electronic components 29, 29' is electrically connected with the second conductors 280b and/or the conductive pillars 23. More specifically, the electronic components 29, 29' are attached onto the second conductors 280b of the electronic structure 2b and the conductive pillars 23 via the conductive bumps 291 by flip-chip bonding, so that the electronic components 29, 29' are electrically connected with the second conductors 280b and the conductive pillars 23, and the underfill 292 is in contact with the second surface 25b of the encapsulation layer 25.

Alternatively, in another embodiment, in an electronic package 2" shown in FIG. 2G", the circuit structure 20 can be omitted as needed. For example, the plurality of conductive components 27 are bonded onto the conductive bumps 22 and the conductive pillars 23, so that each of the conductive components 27 is electrically connected to the first conductor 280a and/or the conductive pillar 23.

Therefore, with the manufacturing method of the present disclosure, the electronic structure 2b used as the auxiliary functional component is embedded in the encapsulation layer 25, so that it can be connected vertically with the electronic component(s) 29, 29'. This helps in accommodating the electronic package 2, 2' to electronic components 29, 29' of different functionalities. As a result, the manufacturing method of the present disclosure requires no re-designing of the electronic package 2, 2', significantly reducing manufacturing cost, and since there is no need to expand the size of the electronic component 29, 29', miniaturization can be achieved.

Moreover, the electrical transmission paths between the electronic structure 2b and the electronic component(s) 29, 29' of the present disclosure can be shortened (as there is no need to pass through a package substrate or a circuit board). This lowers transmission loss and reduces the size of the electronic package 2, 2' while improving electrical performance.

Moreover, part of the electrical function (e.g., power or ground) of the electronic component 29, 29' of the present disclosure can be achieved by using the conductive pillars 23 as the electrical transmission paths, thus there is no need to manufacture an interposer of a large area. Compared to the prior art, the present disclosure can effectively reduce manufacturing cost.

In addition, in the case of a plurality of electronic components 29, 29' are attached on the second surface 25b of the encapsulation layer 25, such as those shown in FIG. 2G' or FIG. 2G", at least two of the electronic components 29, 29' are electrically connected with the second conductors 280b, so that the electronic structure 2b acts as an electrical bridge component between the at least two electronic components 29, 29', which allows the number of contacts of the electronic components 29, 29' to be increased (that is, allows the functions of the electronic package 2' to be increased).

FIGS. 3A to 3F are schematic cross-sectional diagrams illustrating a method for manufacturing an electronic package 3 in accordance with a second embodiment of the present disclosure. This embodiment is different from the first embodiment in the aspect of conductors of an electronic structure 3b, and the remaining processes are generally similar, and thus will not be repeated for conciseness.

Figure 3A:
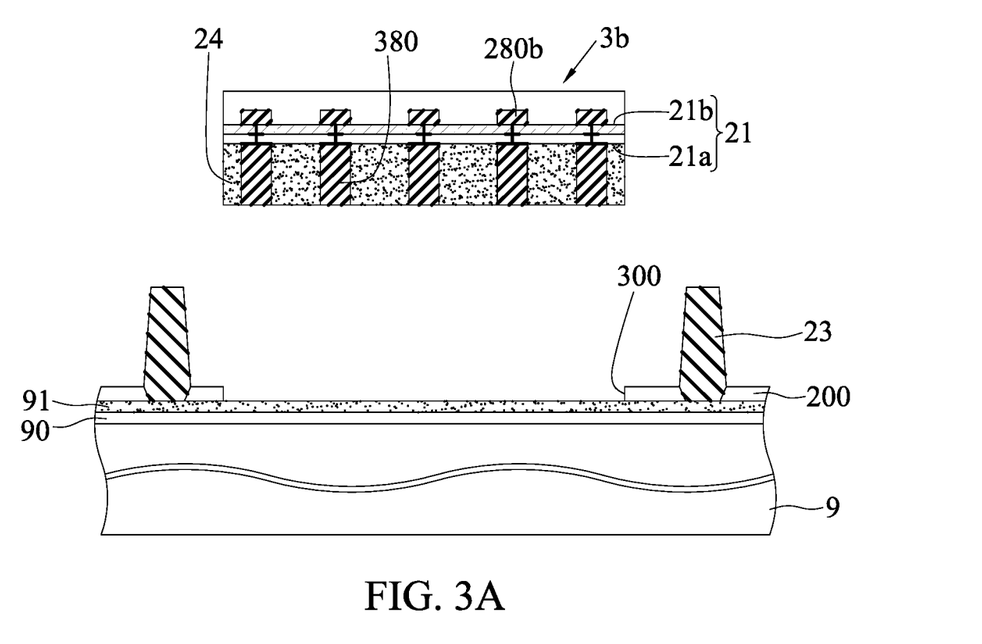
FIGS. 3A to 3F are schematic cross-sectional views illustrating a method for manufacturing an electronic package in accordance with a second embodiment of the present disclosure.

As shown in FIG. 3A, an electronic structure 3b is provided, wherein a first side 21a of an electronic body 21 is formed with a plurality of first conductors 380 that are covered by a bonding layer 24.

In an embodiment, the first conductors 380 are in the shape of long columns, and are made of a metal (e.g., copper) or solder material.

Figure 3B:
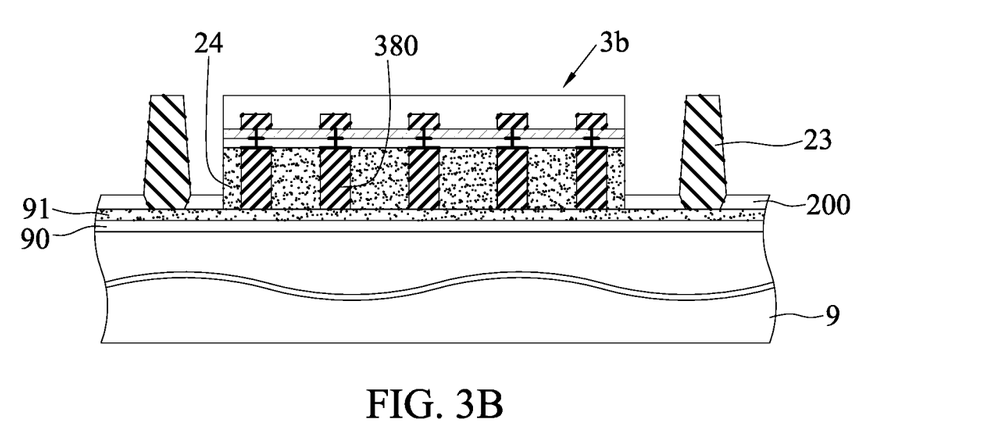

As shown in FIG. 3B, referring to the process described with respect to FIG. 2B, the bonding layer 24 of the electronic structure 3b is pressed against on a dielectric layer 200 through thermal compression, and no conductive bumps 22 need to be formed on the dielectric layer 200.

In an embodiment, the manufacturing processes of the auxiliary conductors 280c and the conductive bumps 22 of the first embodiment are omitted, so the first conductors 380 are exposed from the bonding layer 24, and an opening 300 exposing an adhesive layer 91 can be formed on the dielectric layer 200, as can be seen in FIG. 3A. As a result, the electronic structure 3b can be aligned with the opening 300 and attached on a carrier 9. For example, the bonding layer 24 is planarized by polishing, so the ends of the first conductors 380 are flush with a surface of the bonding layer 24, exposing the first conductors 380 from the bonding layer 24.

Figure 3C:
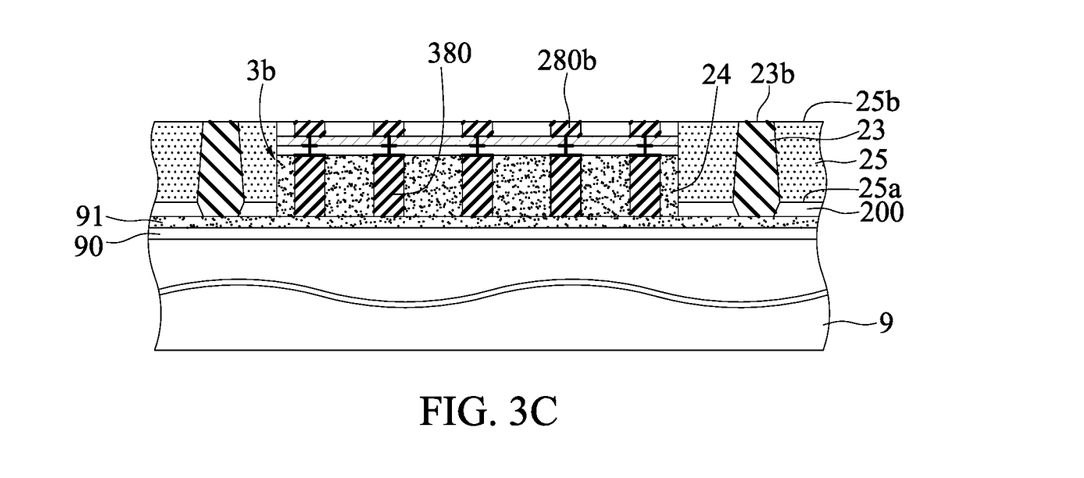

As shown in FIG. 3C, referring to the process described with respect to FIG. 2C, an encapsulation layer 25 is formed to cover the electronic structure 3b and the conductive pillars 23, and then a planarization process is performed.

Figure 3D:
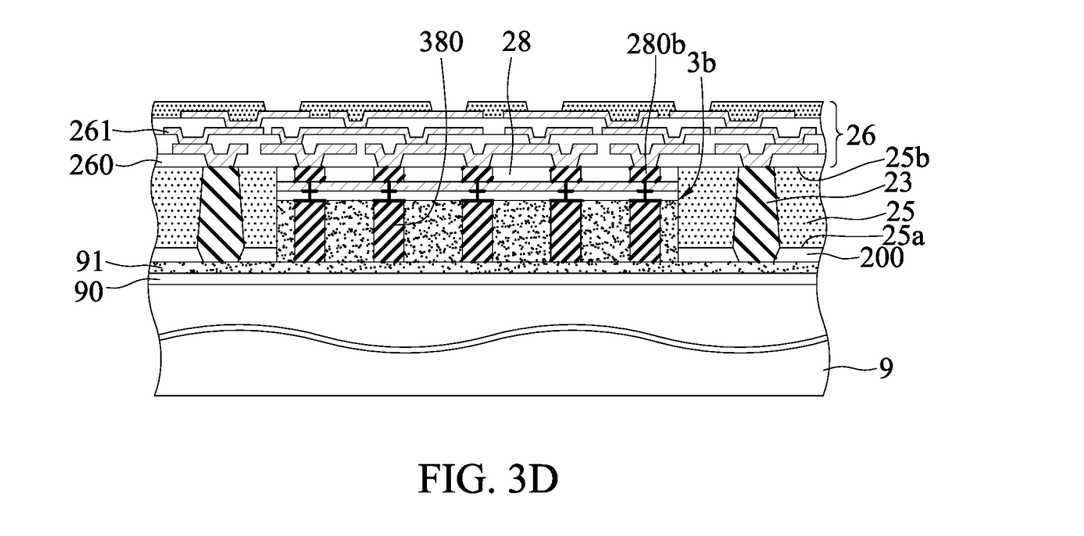

As shown in FIG. 3D, referring to the process described with respect to FIG. 2D, a circuit structure 26 is formed on the encapsulation layer 25.

Figure 3E:
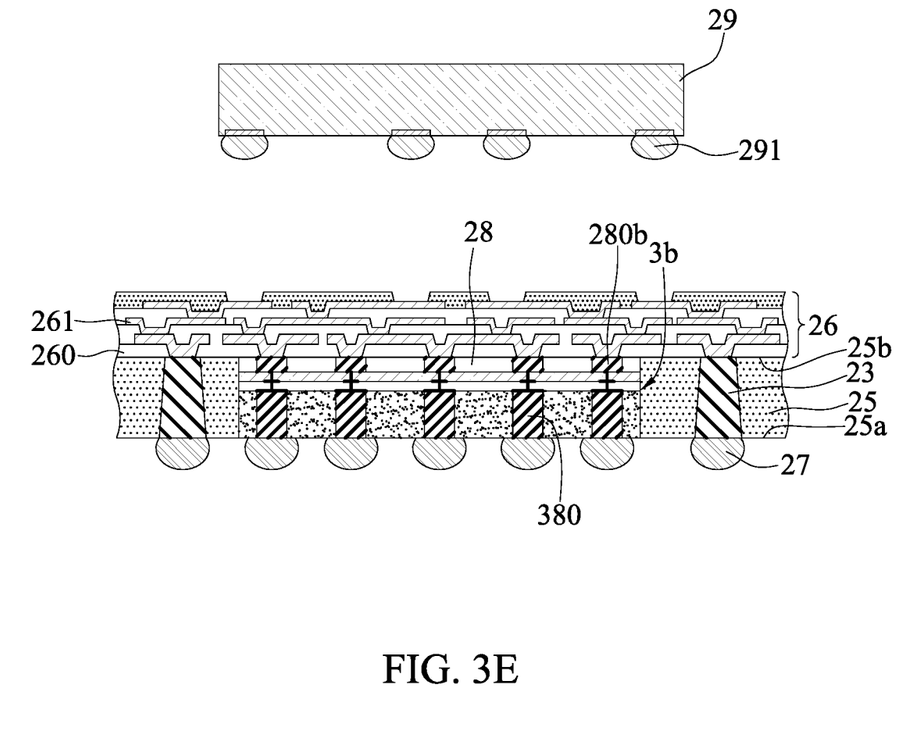
Figure 3F:
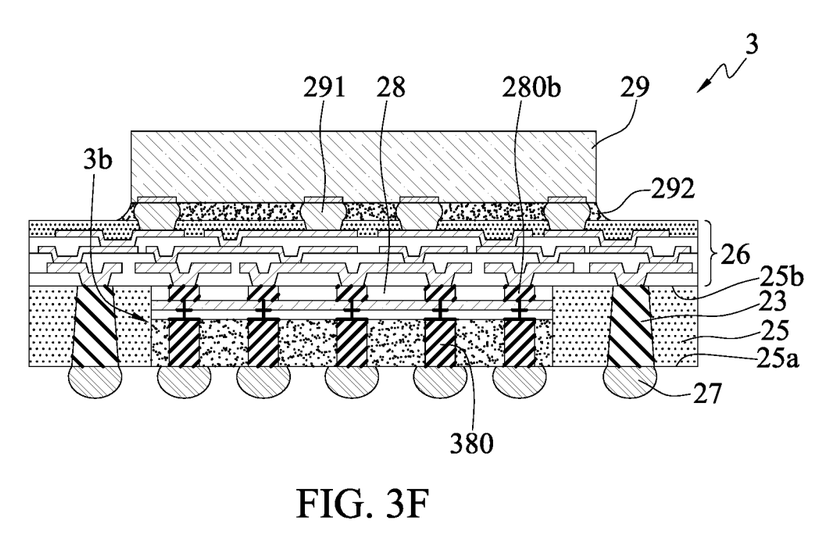

As shown in FIGS. 3E and 3F, referring to the processes described with respect to FIGS. 2E to 2G, the carrier 9 as well as the release layer 90 and the adhesive layer 91 thereon are removed. At least one electronic component 29 is attached onto the circuit structure 26, and a plurality of conductive components 27 are bonded onto the first conductors 380 and the conductive pillars 23 to obtain an electronic package 3, and the conductive components 27 are electrically connected with the first conductors 380.

In an embodiment, after the carrier 9 and the release layer 90 and adhesive layer 91 thereon are removed, the dielectric layer 200 can be planarized by polishing, for example, to remove part of the dielectric layer 200, part of the bonding layer 24, parts of the first conductors 380, and parts of the conductive pillars 23 (or to remove the entire dielectric layer 200 and part of the first surface 25a of the encapsulation layer 25), so as to make the ends of the conductive pillars 23 and the ends of the first conductors 380 flush with a surface of the bonding layer 24 and the dielectric layer 200 (or the first surface 25a of the encapsulation layer 25 shown in FIG. 3E).

Moreover, as shown in an electronic package 3' shown in FIG. 3F, another circuit structure 20 can be formed on the first surface 25a of the encapsulation layer 25, which includes a plurality of dielectric layers 200, 200' and a RDL 201 disposed on the dielectric layers 200, 200'. Also, an insulating protective layer 203 can be formed on the dielectric layer 200', and a plurality of openings are formed on the insulating protective layer 203 to expose the RDL 201 from the openings to facilitate bonding with the conductive components 27. As such, the conductive components 27 can be electrically connected with the conductive pillars 23 and/or the first conductors 380 via the circuit structure 20. It can be appreciated that another circuit structure can also be manufactured on the first surface 25a of the encapsulation layer 25 shown in FIG. 3F. Therefore, the aspect of the circuit structure on the first surface 25a of the encapsulation layer 25 can be designed according to requirements, e.g., as conductive blind vias embedded in a dielectric layer, and there is no special restrictions.

Therefore, the manufacturing method of the present disclosure allows the electronic structure 3b acting as the auxiliary functional component to be embedded in the encapsulation layer 25, so that it can be connected vertically with the electronic component(s) 29, 29'. This helps in accommodating the electronic package 2, 2' to electronic components 29, 29' of different functionalities. As a result, the manufacturing method of the present disclosure requires no re-designing of the electronic package 3, 3', significantly reducing manufacturing cost, and since there is no need to expand the size of the electronic component 29, 29', miniaturization can be achieved.

Moreover, the electrical transmission paths between the electronic structure 3b and the electronic component(s) 29, 29' of the present disclosure can be shortened (as there is no need to pass through a package substrate or a circuit board). This lowers transmission loss and reduces the size of the electronic package 3 while improving electrical performance.

Moreover, part of the electrical function (e.g., power or ground) of the electronic component 29, 29' of the present disclosure can be achieved by using the conductive pillars 23 as the electrical transmission paths, thus there is no need to manufacture an interposer of a large area. Compared to the prior art, the present disclosure can effectively reduce manufacturing cost.

The present disclosure also provides an electronic package 2, 2', 2'', 3, 3', which includes: an encapsulation layer 25, a plurality of conductive pillars 23 and at least one electronic structure 2b, 3b, and the electronic structure 2b, 3b includes an electronic body 21, a plurality of first conductors 280a, 380, a plurality of second conductors 280b, a bonding layer 24, and an insulating layer 28.

The encapsulation layer 25 has a first surface 25a and a second surface 25b opposite to each other.

The conductive pillars 23 are embedded in the encapsulation layer 25.

The electronic structure 2b, 3b is embedded in the encapsulation layer 25.

The electronic body 21 has a first side 21a and a second side 21b opposite to each other, wherein the electronic body 21 includes a base 21' and a circuit portion 21'' formed on the base 21', such that the second side 21b is defined by the base 21', and the first side 21a is defined by the circuit portion 21'', and the base 21' includes a plurality of conductive vias 210 electrically connected to the circuit portion 21'' and exposed from the second side 21b.

The first conductors 280a, 380 are formed on the first side 21a of the electronic body 21 to electrically connect with the circuit portion 21''.

The second conductors 280b are formed on the second side 21b of the electronic body 21 to electrically connect with the conductive vias 210.

The bonding layer 24 is formed on the first side 21a of the electronic body 21 to cover the first conductors 280a, 380.

The insulating layer 28 is formed on the second side 21b of the electronic body 21 to cover the second conductors 280b.

In an embodiment, the base 21' of the electronic body 21 is a silicon material.

In an embodiment, the first conductors 280a, 380 are metal pillars or solder materials.

In an embodiment, auxiliary conductors 280c are formed on the first conductors 280a of the electronic structure 2b and covered by the bonding layer 24.

In an embodiment, the first conductors 380 are exposed from the bonding layer 24.

In an embodiment, ends 23b of the conductive pillars 23, the insulating layer 28 or the second conductors 280b are exposed from the second surface 25b of the encapsulation layer 25.

In an embodiment, the electronic package 2, 2', 3' further includes a circuit structure 20 formed on the first surface 25a of the encapsulation layer 25 and electrically connected with the plurality of conductive pillars 23 and the electronic structure 2b.

In an embodiment, the electronic package 2, 3, 3' further includes a circuit structure 26 formed on the second surface 25b of the encapsulation layer 25 and electrically connected with the plurality of conductive pillars 23 and the electronic structure 2b.

In an embodiment, the electronic package 2, 2', 2", 3, 3' further includes a plurality of conductive components 27 formed on the first surface 25a of the encapsulation layer 25 and electrically connected with the conductive pillars 23 and/or the first conductors 280a, 380.

In an embodiment, the electronic package 2, 2', 2", 3, 3' further includes at least one electronic component 29, 29' attached to the second surface 25b of the encapsulation layer 25 and electrically connected with the second conductors 280b and/or the conductive pillars 23.

In an embodiment, the electronic package 2', 2" further includes a plurality of electronic components 29, 29' attached to the second surface 25b of the encapsulation layer 25, and at least two of the electronic components 29, 29' are electrically connected to the second conductors 280b, such that the electronic structure 2b acts as an electrical bridge component between the at least two electronic components 29, 29'.

In conclusion, the electronic package and the manufacturing method thereof in accordance with the present disclosure allows close-range cooperation with the electronic component by embedding the electronic structure in the encapsulation layer. As a result, the present disclosure requires no re-designing of the electronic package, thus significantly reducing manufacturing cost, and since there is no need to expand the size of the electronic component, the demand for miniaturization can be satisfied while achieving high electrical performance.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
an encapsulation layer having a first surface and a second surface opposite to each other;
a plurality of conductive pillars embedded in the encapsulation layer; and
an electronic structure embedded in the encapsulation layer and including:
an electronic body having a first side and a second side opposite to each other, and including a base and a circuit portion formed on the base, wherein the second side is defined by the base, and the first side is defined by the circuit portion, and the base includes a plurality of conductive vias electrically connected to the circuit portion and exposed from the second side;
a plurality of first conductors formed on the first side of the electronic body to electrically connect with the circuit portion;
a plurality of second conductors formed on the second side of the electronic body to electrically connect with the conductive vias;
a bonding layer formed on the first side of the electronic body to cover the first conductors, wherein the bonding layer is a film body of a non-conductive film such that side surfaces of the bonding layer are straight, and a material of the bonding layer is different from a material of the encapsulation layer;
an insulating layer formed on the second side of the electronic body to cover the second conductors;
a plurality of auxiliary conductors formed on each of the plurality of first conductors and covered by the bonding layer; and
a circuit structure formed on the first surface of the encapsulation layer and electrically connected with the plurality of conductive pillars and the electronic structure, wherein the circuit structure includes a plurality of dielectric layers and a plurality of conducive bumps are formed on the dielectric layers, such that the auxillary conductors are bonded to the conductive bumps through a surface treatment layer, and the bonding layer covers the conductive bumps.

2. The electronic package of claim 1, wherein the base of the electronic body is a silicon material.

3. The electronic package of claim 1, wherein the first conductors are metal pillars or solder materials.

4. The electronic package of claim 1, wherein ends of the conductive pillars, the insulating layer or the second conductors are exposed from the second surface of the encapsulation layer.

5. The electronic package of claim 1, further comprising another circuit structure formed on the second surface of the encapsulation layer and electrically connected with the plurality of conductive pillars and the electronic structure.

6. The electronic package of claim 1, further comprising a plurality of conductive components formed on the first surface of the encapsulation layer and electrically connected with the conductive pillars and/or the first conductors.

7. The electronic package of claim 1, further comprising an electronic component attached onto the second surface of the encapsulation layer and electrically connected with the second conductors and/or the conductive pillars.

8. The electronic package of claim 1, further comprising a plurality of electronic components attached onto the second surface of the encapsulation layer, wherein at least two of the plurality of electronic components are electrically connected to the second conductors, such that the electronic structure acts as an electrical bridge component between the at least two electronic components.

* * * * *